US008816775B2

(12) United States Patent
Annes et al.

(10) Patent No.: US 8,816,775 B2
(45) Date of Patent: Aug. 26, 2014

(54) QUIESCENT CURRENT DETERMINATION USING IN-PACKAGE VOLTAGE MEASUREMENTS

(75) Inventors: Justin N Annes, Chandler, AZ (US); Mario M Bokatius, Chandler, AZ (US); Paul R Hart, Phoenix, AZ (US); Joseph Staudinger, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 75 days.

(21) Appl. No.: 13/614,850

(22) Filed: Sep. 13, 2012

(65) Prior Publication Data

US 2014/0070881 A1   Mar. 13, 2014

(51) Int. Cl.
*H03F 3/04* (2006.01)

(52) U.S. Cl.
USPC .......................................... 330/296; 330/285

(58) Field of Classification Search
USPC ................................. 330/296, 285, 302, 279
See application file for complete search history.

(56) References Cited

U.S. PATENT DOCUMENTS

| 5,373,251 | A | * | 12/1994 | Kunitomo et al. | ............. | 330/279 |
| 6,639,471 | B2 | * | 10/2003 | Matsuura et al. | ............. | 330/302 |
| 7,102,376 | B2 | | 9/2006 | Iwagami et al. | | |
| 7,315,152 | B1 | | 1/2008 | Epperson et al. | | |
| 7,616,060 | B2 | * | 11/2009 | Yamamoto et al. | ............. | 330/284 |
| 8,354,888 | B2 | * | 1/2013 | Matsuzuka et al. | ............. | 330/296 |
| 2011/0298538 | A1 | | 12/2011 | Andrys et al. | | |

OTHER PUBLICATIONS

Maxim Integrated. High-Side Current-Sense Measurement: Circuits and Principles. Nov. 19, 2001. Retrieved from the Internet at: http://www.maxim-ic.com/app-notes/index.mvp/id/746.
Texas Instruments. Traditional High Side Current Sensing. Sep. 13, 2012. Retrieved from the Internet at: http://www.ti.com/analog/docs/microsite.tsp?sectionId=560&tabId=2182&micrositeId=7.
Rohm. Ultra-Low Ohmic Chip Resistors for Current Detection PMR Series. Sep. 13, 2012. Retrieved from the Internet at: http://www.rohm.com/web/global/news-detail?news-title=ultra-low-ohmic-chip-resistors-for-current-detection-pmr-series&defaultGroupId=false.

* cited by examiner

*Primary Examiner* — Henry Choe
(74) *Attorney, Agent, or Firm* — Ingrassia Fisher & Lorenz, P.C.

(57) ABSTRACT

Apparatus, systems, and fabrication methods are provided for biasing amplifier arrangements inside device packages to a target quiescent current. In one embodiment, an amplifier device has an output interface and includes an amplifier arrangement having an amplifier output and impedance matching circuitry coupled between the amplifier output and the output interface. A method for biasing the amplifier arrangement involves measuring or otherwise obtaining a voltage between the amplifier output and the output interface, determining an estimated quiescent current through the amplifier arrangement based on that voltage, and adjusting a bias voltage provided to the input of the amplifier arrangement based on a difference between the estimated quiescent current. In exemplary embodiments, the bias voltage is adjusted until the estimated quiescent current is substantially equal to a target quiescent current.

17 Claims, 7 Drawing Sheets

US 8,816,775 B2

QUIESCENT CURRENT DETERMINATION USING IN-PACKAGE VOLTAGE MEASUREMENTS

TECHNICAL FIELD

Embodiments of the subject matter described herein relate generally to electronic circuits, and more particularly, embodiments of the subject matter relate to amplifiers and current determination using voltage measured inside an amplifier device package.

BACKGROUND

Amplifiers are commonly used to amplify a signal. For example, in radio frequency (RF) or cellular applications, base stations or other infrastructure components employ amplifiers to broadcast signals over greater distances. In practice, amplifiers are often biased to operate in a desired manner for a given application. For example, for communication schemes having relatively high peak-to-average ratios, Doherty amplifier topologies are commonly used to improve efficiency. A Doherty amplifier topology typically includes a pair of amplifiers, a main (or carrier) amplifier and a peaking (or auxiliary) amplifier, where the peaking amplifier is biased to turn on when the input signal increases above a level that would cause the main amplifier to saturate, thereby reducing the impedance at the output of the main amplifier to enable the main amplifier to deliver more current in conjunction with current delivered by the peaking amplifier.

Due to manufacturing variations, the characteristics of a particular amplifier circuit topology will vary across individual devices. Accordingly, biasing amplifiers often involves applying an initial bias voltage, measuring the resulting quiescent current consumed by the amplifier, and adjusting the bias voltage to achieve the desired quiescent current and/or operating mode. In some situations, this is done when the amplifier device is manufactured, such that the bias point of the amplifier device is not adjustable during subsequent operation. Other approaches involve the use of additional external circuitry, which increases the complexity and/or size requirements for the amplifier system, or the introduction of current sensing elements that are electrically in series with the amplifier, reduces the efficiency of the amplifier system.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate to biasing packaged amplifier arrangements based on voltages measured within the device package. As described in greater detail below, in exemplary embodiments, a voltage between an output terminal of an amplifier arrangement and a physical output interface of an amplifier device package is obtained or otherwise measured using individual conductive elements, such as bondwires. For example, in one embodiment, a first individual bondwire is connected between the amplifier output terminal and a first node within the amplifier device package and a second individual bondwire is connected between the output interface and a second node within the amplifier device package, wherein the voltage difference between the two nodes is sensed or otherwise measured to obtain a measured voltage corresponding to the voltage difference between the output terminal of the amplifier arrangement and the physical output interface of the amplifier device package, alternatively referred to herein as a measured die-to-lead voltage. An estimated quiescent current through the amplifier arrangement is then calculated or otherwise determined based on that measured voltage using a previously characterized relationship between the voltage across the electrical connection between the amplifier output terminal and the output interface and the corresponding current through the electrical connection resulting from that voltage across it. Based on differences between the estimated quiescent current and a target quiescent current through the amplifier arrangement, the bias voltage applied to the input terminal of the amplifier arrangement is adjusted until the estimated quiescent current is substantially equal to a target quiescent current, and the bias voltage resulting in the target quiescent current is maintained during subsequent operation of the amplifier arrangement. As used herein, quiescent current should be understood as referring to the current that flows through an amplifier arrangement in the absence of an alternating electrical input signal (e.g., no radio frequency (RF) or other alternating current (AC) signals at the input of the amplifier arrangement).

Figure 1:
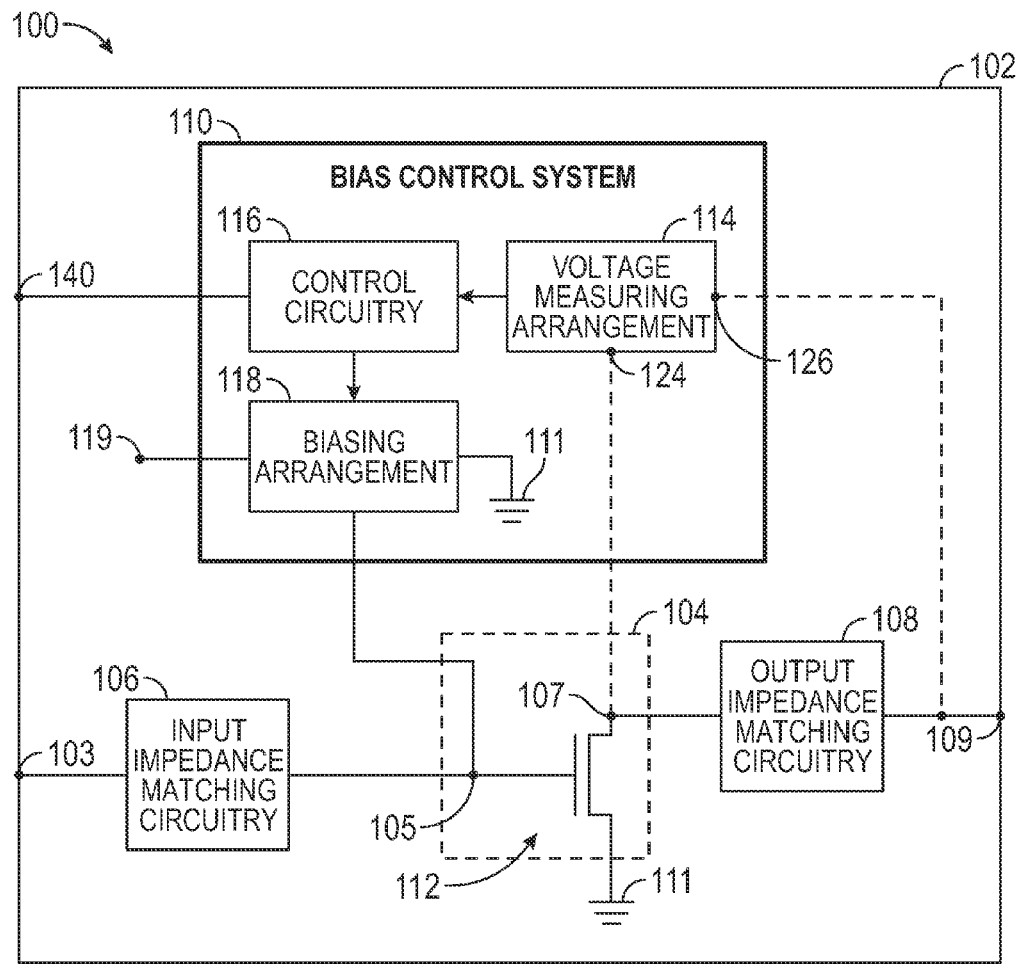
FIG. 1 is a block diagram of an exemplary amplifier system in accordance with one embodiment of the invention.

Turning now to FIG. 1, in an exemplary embodiment, an amplifier system 100 is implemented in a common device package or integrated circuit to provide an amplifier device 102 that includes, without limitation, an amplifier arrangement 104, input impedance matching circuitry 106 coupled between an input interface 103 of the amplifier device 102 and an input terminal 105 of the amplifier arrangement 104, output impedance matching circuitry 108 coupled between an output terminal 107 of the amplifier arrangement 104 and an output interface 109 of the amplifier device 102, and a bias control system 110. For ease of explanation, but without limitation, the input terminal 105 and output terminal 107 of the amplifier arrangement 104 may alternatively be referred to herein as the amplifier input and the amplifier output, respectively, while the input interface 103 and output interface 109 of the amplifier device package 102 may alternatively be referred to herein as the device input and device output, respectively. In exemplary embodiments, the bias control system 110 is coupled to the amplifier output 107 and the device output 109 to measure or otherwise obtain a voltage differential between the amplifier output 107 and the device output 109, determine a corresponding quiescent current (or direct current (DC) bias current) though the amplifier arrangement 104, and adjust a DC bias voltage at the amplifier input 105 to achieve a desired quiescent current through the amplifier arrangement 104, as described in greater detail below in the context of FIG. 2.

It should be understood that FIG. 1 is a simplified representation of an amplifier system 100 for purposes of explanation and ease of description and is not intended to limit the subject matter described herein in any way. In this regard, the subject matter described herein is not intended to be limited to any particular amplifier topology or any particular amplifier arrangement. Accordingly, while the subject matter may be described herein in the context of an N-type field-effect transistor amplifier arrangement, in practice, any suitable amplifier arrangement may be utilized. Additionally, practical embodiments may include other devices and components to provide additional functions and features, and/or the amplifier system 100 may be part of a much larger electrical system, as will be understood. Thus, although FIG. 1 depicts direct electrical connections between circuit elements and/or terminals, alternative embodiments may employ intervening circuit elements and/or components while functioning in a substantially similar manner. Furthermore, in some embodiments, the amplifier device package may include additional input and/or output interfaces to accommodate an external bias control system or other control circuitry residing outside the amplifier device package that supports operation of the amplifier device 102 and the biasing processes described herein.

In an exemplary embodiment, the amplifier arrangement 104 is realized as one or more transistor devices 112 configured as a particular class of amplifier to generate or otherwise provide an amplified version of the input signal at the amplifier input 105 at the amplifier output 107. For example, in the illustrated embodiment, the amplifier arrangement 104 is realized as a transistor 112 having a control terminal that is connected to or otherwise functions as the amplifier input 105 and an output terminal that is connected to or otherwise functions as the amplifier output 107. The illustrated transistor 112 is an N-type metal-oxide-semiconductor (MOS) field-effect transistor 112 having a gate terminal connected to or otherwise corresponding to the amplifier input terminal 105 and a drain terminal connected to or otherwise corresponding to the amplifier output terminal 107, with the source terminal of the transistor 112 being coupled to a node 111 configured to receive or otherwise provide a ground reference voltage for the amplifier device 102.

In the illustrated embodiment, the device input 103 and the device output 109 generally represent the package leads, pins, or other physical interfaces for creating electrical connections to the internal components (e.g., amplifier arrangement 104) of the amplifier device 102. The input impedance matching circuitry 106 is coupled between the device input 103 and the amplifier input 105 (or gate terminal of transistor 112) and configured to provide a desired input impedance at the device input 103 at the fundamental frequency (or carrier frequency) of the amplifier system 100. Depending on the embodiment, the input impedance matching circuitry 106 may be realized as a low-pass impedance matching circuit topology, a high-pass impedance matching circuit topology, a band-pass impedance matching circuit topology, or another suitable impedance matching circuit topology. For example, in one or more embodiments, the input impedance matching circuitry 106 may be realized as a shunt capacitance (or "T-match") impedance matching circuit topology, which is a low-pass impedance matching circuit topology, while in alternative embodiments, the input impedance matching circuitry 106 may be realized as a shunt inductance (or "shunt-L") impedance matching circuit topology, which is a high-pass impedance matching circuit topology. The output impedance matching circuitry 108 is coupled between the device output 109 and the amplifier output 107 (or drain terminal of the transistor 112) to provide a desired output impedance at the device output 109 at the fundamental frequency of the amplifier system 100. Again, depending on the embodiment, the output impedance matching circuitry 108 may be realized as a low-pass impedance matching circuit topology (e.g., a shunt capacitance impedance matching circuit topology), a high-pass impedance matching circuit topology (e.g., a shunt inductance impedance matching circuit topology), a band-pass impedance matching circuit topology, or another suitable impedance matching circuit topology. In accordance with one or more embodiments, the amplifier system 100 is used to transmit radio frequency signals, wherein the fundamental frequency (or carrier frequency) is the frequency of transmittance. It should be noted that in some embodiments, the amplifier device 102 may not include output impedance matching circuitry 108, in which case the amplifier output 107 is electrically connected directly to the device output 109, for example, via one or more bondwires.

The bias control system 110 generally represents the combination of circuitry, hardware, processing logic and/or other components of the amplifier system 100 configured to measure or otherwise obtain the voltage differential between the amplifier output 107 and the device output 109 (e.g., the voltage drop across the electrical connection between the amplifier output 107 and the device output 109) and adjust the bias voltage at the amplifier input 105 based on that obtained voltage, as described in greater detail below. In the illustrated embodiment, the bias control system 110 includes voltage measuring arrangement 114 coupled to the amplifier output 107 and the device output 109, control circuitry 116, and a biasing arrangement 118 coupled to the amplifier input 105. In accordance with one or more embodiments, the voltage measuring arrangement 114, control circuitry 116, and biasing arrangement 118 are integrated or otherwise implemented on a common semiconductor substrate or die 120 that is mounted or otherwise affixed to the package substrate 122 (e.g., a copper flange, a lead frame, or the like) for the amplifier device 102. In other words, the bias control system 110 may be realized as an individual discrete device package or integrated circuit (e.g., an application-specific integrated circuit) that is provided within the larger amplifier device package 102.

The biasing arrangement 118 is coupled between a node 119 configured to receive a positive reference (or supply) voltage for the amplifier device 102 and the ground reference voltage node 111 and provides a bias voltage to the amplifier input 105. In this regard, the bias voltage is a DC voltage that dictates or otherwise controls the operating mode (or class of operation) of the amplifier arrangement 104, for example, by controlling the conduction angle of the transistor 112. In exemplary embodiments, bias voltage provided by the biasing arrangement 118 to the amplifier input 105 is adjustable, and the biasing arrangement 118 provides a bias voltage to the amplifier input 105 that is based on signals received from the control circuitry 116. For example, the biasing arrangement 118 may be realized as an adjustable voltage divider or a digital-to-analog converter that provides a ratio (or fraction) of the supply voltage to the amplifier input 105, wherein the control circuitry 116 signals, commands, controls or otherwise operates the biasing arrangement 118 to adjust the ratio of the supply voltage provided to the amplifier input 105. As described in greater detail below in the context of FIGS. 3-5, in accordance with one or more embodiments, an individual wire or another conductive element in the amplifier device package 102 is utilized to electrically connect the biasing arrangement 118 to the amplifier input 105.

In the illustrated embodiment of FIG. 1, the voltage measuring arrangement 114 includes or otherwise provides a first input node 124 coupled to the amplifier output 107 and a second input node 126 coupled to the device output 109. The voltage measuring arrangement 114 generates or otherwise provides an output signal indicative of the voltage difference between the nodes 124, 126 while providing a relatively high input impedance at nodes 124, 126, such that the voltage difference between nodes 124, 126 is substantially equal to the voltage difference between the amplifier output 107 and the device output 109 and relatively no current flows to/from the high impedance input nodes 124, 126. In other words, the input impedance at each of the nodes 124, 126 is greater than the series impedance of the electrical connection between the amplifier output 107 and the device output 109. In exemplary embodiments, the input impedance provided at nodes 124, 126 by the voltage measuring arrangement 114 at the fundamental frequency is greater than the impedance of the output impedance matching circuitry 108 (e.g., the series impedance between the amplifier output 107 and the device output 109) by a factor of at least 100. In accordance with one embodiment, the voltage measuring arrangement 114 is realized as a differential amplifier configured as a high side current sensing arrangement that provides a relatively high input impedance between the input nodes 124, 126.

As described in greater detail below in the context of FIGS. 3-5, in exemplary embodiments, an individual wire or another conductive element in the amplifier device package 102 is utilized to electrically connect the amplifier output 107 to the first high impedance input node 124 and a second individual wire or other conductive element is utilized to electrically connect the device output 109 to the second high impedance input node 126. By virtue of the relatively high input impedance at nodes 124, 126, a negligible amount of current flows through the individual wires and there is substantially zero voltage drop across the wires, thereby allowing the voltage measuring arrangement 114 to obtain the voltage of the amplifier output 107 at first high impedance input node 124 and the voltage of the device output 109 at the second high impedance input node 126, thereby allowing the voltage measuring arrangement 114 to sense or otherwise measure the voltage difference between the amplifier output 107 and the device output 109.

Still referring to FIG. 1, the control circuitry 116 generally represents the combination of circuitry, hardware, processing circuitry, logic and/or other components of the bias control system 110 coupled to voltage measuring arrangement 114 and the control circuitry 116 to receive or otherwise obtain the output signal generated by the voltage measuring arrangement 114 that is indicative of the measured voltage difference between the amplifier output 107 and the device output 109 and adjust the bias voltage provided to the amplifier input 105 based on the measured voltage provided by the voltage measuring arrangement 114. Depending on the embodiment, the control circuitry 116 may be realized as a logic circuit (e.g., an ASIC), a processing core, a processing unit, a general purpose processor, a microprocessor, a microcontroller, a content addressable memory, a digital signal processor, a field programmable gate array, any suitable programmable logic device, gate or transistor logic, analog components, or any combination thereof, designed to support operation of the bias control system 110 and/or perform the functions described herein. In practice, the control circuitry 116 may also include or otherwise access a data storage element or memory, such as, for example, random access memory (RAM), read-only memory (ROM), flash memory, registers, or another suitable non-transitory computer-readable storage medium configured to support operation of the bias control system 110. For example, in some embodiments, the memory may store computer-executable programming instructions that, when read and executed by the control circuitry 116, cause the control circuitry 116 to perform one or more additional tasks, operations, functions, and/or processes described herein. Additionally, in exemplary embodiments, the control circuitry 116 maintains (e.g., in memory) information indicative of the relationship between current though the output impedance matching circuitry 108 and the corresponding voltage across the output impedance matching circuitry 108, that is, the effective DC impedance of the output impedance matching circuitry 108. For example, the current through the output impedance matching circuitry 108 may be characterized as a function of the voltage across the output impedance matching circuitry 108, wherein the control circuitry 116 stores or otherwise maintains the coefficients for determining an estimated current through the output impedance matching circuitry 108 based on the measured voltage difference across the output impedance matching circuitry 108 obtained from the voltage measuring arrangement 114 and the relationship between voltage and current for the output impedance matching circuitry 108. In some embodiments, the control circuitry 116 also maintains information indicative of the relationship between the bias voltage applied to the amplifier input 105 and the resulting quiescent current though the output impedance matching circuitry 108 (or the resulting voltage across the output impedance matching circuitry 108) during normal operation for purposes of identifying or otherwise detecting a fault condition, as described in greater detail below in the context of FIG. 2.

In exemplary embodiments, the control circuitry 116 identifies, stores, or otherwise obtains a target quiescent current through the amplifier arrangement 104, and based on the difference between the estimated quiescent current and the target quiescent current, determines an adjusted bias voltage for the amplifier arrangement 104 intended to produce the target quiescent current through the amplifier arrangement 104. For example, in some embodiments, the amplifier device 102 may include one or more additional input interfaces 140 (e.g., one or more additional package leads, pins, terminals, or the like) for receiving or otherwise obtaining an indication of the target quiescent current from an external circuit, device or system. The control circuitry 116 signals, commands, instructs, or otherwise controls the biasing arrangement 118 to provide the adjusted bias voltage to the amplifier input 105, obtains the resulting measured voltage from the voltage measuring arrangement 114, and repeats the steps of adjusting the bias voltage and obtaining the resulting measured voltage from the voltage measuring arrangement 114 until the measured voltage is substantially equal to or otherwise corresponds to the target quiescent current. In alternative embodiments, the control circuitry 116 provides measured voltage difference output by the voltage measuring arrangement 114 (or the estimated quiescent current based thereon) to an external device or system (e.g., via an output interface), wherein the external device or system determines an adjusted bias voltage for the amplifier arrangement 104 and signals, indicates, or otherwise provides the adjusted bias voltage to the control circuitry 116 (e.g., via interface 140) for operating the biasing arrangement 118. In some embodiments, the control circuitry 116 provides the measured voltage difference output by the voltage measuring arrangement 114 (or the estimated quiescent current based thereon) and/or the bias voltage provided by the biasing arrangement 118 to the external device or system to facilitate bias voltage adjustments during operation of the amplifier system 100 as needed to suit a particular application.

Figure 2:
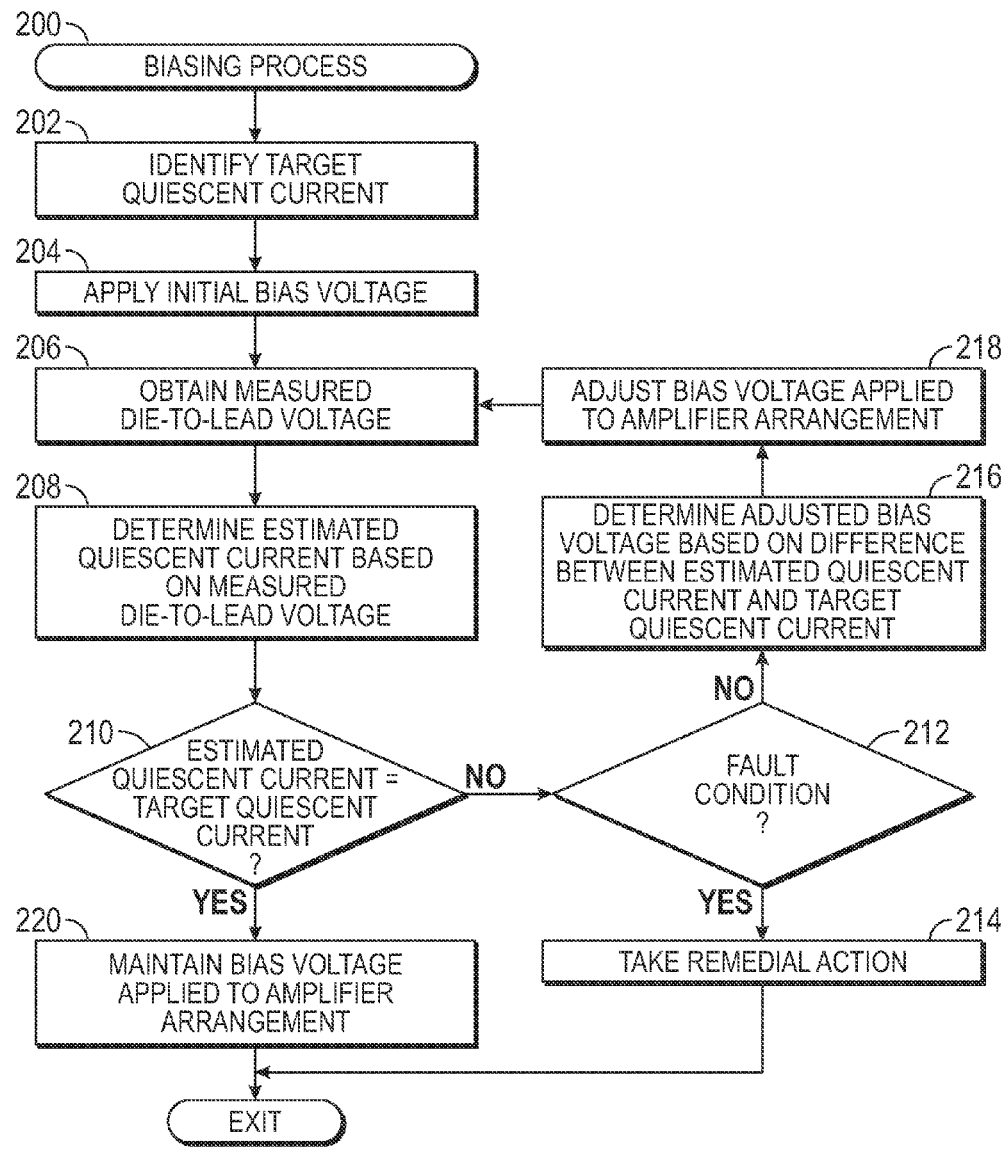
FIG. 2 is a flow diagram illustrating an exemplary biasing process suitable for implementation by the amplifier system of FIG. 1 in accordance with one embodiment of the invention.

FIG. 2 depicts an exemplary embodiment of a biasing process 200 suitable for implementation by the amplifier system 100 to bias the amplifier arrangement 104 for a target quiescent current. The various tasks performed in connection with the illustrated process 200 may be performed by hardware, suitably configured analog circuitry, software executed by processing circuitry (e.g., control circuitry 116), firmware executable by processing circuitry, or any combination thereof. For illustrative purposes, the following description may refer to elements mentioned above in connection with FIG. 1. In practice, portions of the biasing process 200 may be performed by different elements of the amplifier system 100, such as, for example, the voltage measuring arrangement 114, the control circuitry 116 and/or the biasing arrangement 118. It should be appreciated that practical embodiments of the biasing process 200 may include any number of additional or alternative tasks, the tasks need not be performed in the illustrated order and/or the tasks may be performed concurrently, and/or the biasing process 200 may be incorporated into a more comprehensive procedure or process having additional functionality not described in detail herein. Moreover, one or more of the tasks shown and described in the context of FIG. 2 could be omitted from a practical embodiment of the biasing process 200 as long as the intended overall functionality remains intact.

In an exemplary embodiment, the biasing process 200 initializes or otherwise begins in response to the amplifier device 102 being powered on (e.g., in response to the supply voltage being provided to node 119), or alternatively, in response to receiving signals indicative of a desire to bias the amplifier device 102 to a particular quiescent current (e.g., in response to the control circuitry 116 receiving signals at input 140). In the illustrated embodiment, the biasing process 200 begins by obtaining or otherwise identifying a target quiescent current for the amplifier arrangement and applying or otherwise providing an initial bias voltage to the amplifier arrangement (tasks 202, 204). For example, in accordance with one embodiment, the control circuitry 116 identifies the target quiescent current for the amplifier arrangement 104 based on input signals indicative of a desired quiescent current received at the input 140. In other embodiments, the control circuitry 116 may store or otherwise maintain the target quiescent current for the amplifier arrangement 104 (e.g., in a register or another non-volatile memory). After identifying the target quiescent current, the control circuitry 116 configures the biasing arrangement 118 to provide an initial bias voltage to the amplifier input 105. In some embodiments, the control circuitry 116 may determine the initial bias voltage based on the target quiescent current. For example, the control circuitry 116 may determine an initial bias voltage based on the previously characterized relationship between the bias voltage and the resulting quiescent current through the output impedance matching circuitry 108. In other embodiments, the control circuitry 116 may determine an initial ratio of the supply voltage at node 119 to be provided to the amplifier input 105 that corresponds to the ratio of the target quiescent current to the range of quiescent current capable of being accommodated by the amplifier arrangement 104. In yet other embodiments, the control circuitry 116 determines that the initial bias voltage should be equal to a default initial bias voltage for the amplifier arrangement 104. For example, in some embodiments, by default, the control circuitry 116 may apply an initial bias voltage corresponding to a default ratio of the supply voltage at node 119.

After applying an initial bias voltage to the amplifier arrangement, the biasing process 200 continues by measuring or otherwise obtaining the voltage difference between the output terminal of the amplifier arrangement and the output of the amplifier device package and calculating or otherwise determining an estimated bias current through the amplifier arrangement based on that measured voltage (tasks 206, 208). In this regard, while the initial bias voltage is applied at the amplifier input 105, the control circuitry 116 obtains, from the voltage measuring arrangement 114, the measured voltage difference between the amplifier output 107 and the device output 109, which also corresponds to the voltage across the output impedance matching circuitry 108. As described in greater detail below in the context of FIGS. 3-5, in exemplary embodiments, the voltage that is sensed or otherwise measured by the voltage measuring arrangement 114 corresponds to the voltage difference between the device output 109 of the amplifier device package 102 and a conductive contact region for the output terminal of the transistor 112 where the amplified output signal is present that is formed on the semiconductor substrate (or die) having the transistor 112 formed thereon. Accordingly, for convenience, but without limitation, the voltage measured by the voltage measuring arrangement 114 may alternatively be referred to herein as the measured die-to-lead voltage. In exemplary embodiments, after obtaining the measured die-to-lead voltage from the voltage measuring arrangement 114, the control circuitry 116 calculates or otherwise determines an estimated quiescent current through the amplifier arrangement 104 in response to the initial bias voltage based on the previously characterized relationship between the voltage across the output impedance matching circuitry 108 and the corresponding current through the output impedance matching circuitry 108. For example, when the control circuitry 116 stores or otherwise maintains one or more coefficients indicative of the relationship between voltage and current for the output impedance matching circuitry 108, the control circuitry 116 determines the estimated current through the output impedance matching circuitry 108 as a function of the measured die-to-lead voltage using those coefficients.

After determining an estimated quiescent current through the amplifier arrangement, the biasing process 200 continues by determining whether the estimated quiescent current is substantially equal to the target quiescent current (task 210). In accordance with one embodiment, the control circuitry 116 determines that the estimated quiescent current is substantially equal to the target quiescent current when the difference between the estimated quiescent current and the target quiescent current is less than a threshold value corresponding to realistic and/or practical operating tolerances. In one embodiment, the threshold value corresponds to the resolution of the voltage measuring arrangement 114, that is, the minimum amount of change in current through the output impedance matching circuitry 108 and/or voltage across the output impedance matching circuitry 108 measurable by the voltage measuring arrangement 114. For example, if the voltage measuring arrangement 114 is not capable of detecting incremental changes in current through the output impedance matching circuitry 108 that are less than one microamperes, the control circuitry 116 may determine the estimated quiescent current is substantially equal to the target quiescent current when the difference between the estimated quiescent current and the target quiescent current is less than one microampere. In another embodiment, the threshold value corresponds to the resolution of the biasing arrangement 118, that is, the average amount of change in current through the output impedance matching circuitry 108 and/or voltage across the output impedance matching circuitry 108 in response to an incremental change in the bias voltage provided by the biasing arrangement 118. In yet other embodiments, the control circuitry 116 may determine the estimated quiescent current is substantially equal to the target quiescent current when the difference between the estimated quiescent current and the target quiescent current is less than a threshold percentage of the target quiescent current (e.g., less than two percent of the target quiescent current).

Still referring to FIG. 2, in the illustrated embodiment, in response to determining the estimated quiescent current is not substantially equal to the target quiescent current, the biasing process 200 continues by determining whether or not a fault condition exists within the amplifier device based on the estimated quiescent current (or the measured die-to-lead voltage) before adjusting the bias voltage applied to the amplifier arrangement (task 212). For example, the relationship between the bias voltage applied to the amplifier input 105 and the resulting quiescent current though the output impedance matching circuitry 108 (or the resulting voltage across the output impedance matching circuitry 108) may be characterized, wherein the control circuitry 116 stores or otherwise maintains the coefficients for determining an expected quiescent current through the output impedance matching circuitry 108 based on the bias voltage. In this regard, the control circuitry 116 may calculate or otherwise determine the expected quiescent current based on the bias voltage currently being applied to the amplifier input 105 and identify a fault condition when a difference between the estimated quiescent current and the expected quiescent current exceeds a threshold value indicative of a fault condition. In accordance with one or more embodiments, the threshold value indicative of a fault condition is chosen to be equal to percentage (or fraction) of a prescribed range (or tolerance) for quiescent current variations, wherein the control circuitry 116 may identify a fault condition when a difference between the estimated quiescent current and the expected quiescent current exceeds the threshold value. For example, the control circuitry 116 may identify a fault condition when the difference between the estimated quiescent current and the expected quiescent current exceeds fifty percent of the quiescent current tolerance. In this regard, the threshold value may be indicative of a deviation in the quiescent current for a given bias voltage that is greater than deviations in the quiescent current that are likely to be attributable to manufacturing variations. In response to identifying a fault condition, the biasing process 200 continues by taking one or more remedial actions to protect the amplifier device and/or other components or systems that may be coupled to the amplifier device (task 214). For example, the control circuitry 116 may configure the biasing arrangement 118 to provide a bias voltage equal to the ground reference voltage at node 111 to the amplifier input 105, and the control circuitry 116 may generate an indication of a fault condition that is provided to external systems, devices and/or circuitry via an output of the amplifier device package 102.

When the biasing process 200 determines that a fault condition does not exist within the amplifier device, the biasing process 200 continues by calculating or otherwise determining an adjusted bias voltage for the amplifier arrangement based on the difference between the estimated quiescent current and the target quiescent current and adjusts the bias voltage applied to the amplifier arrangement so that the adjusted bias voltage is applied (tasks 216, 218). For example, in some embodiments, based on the previously characterize relationship between the bias voltage applied to the amplifier input 105 and the expected quiescent current though the output impedance matching circuitry 108, the control circuitry 116 may calculate or otherwise determine an amount by which the bias voltage at the amplifier input 105 should be increased and/or decreased to produce a corresponding increase and/or decrease in the quiescent current through the output impedance matching circuitry 108 that is equal to the difference between the estimated quiescent current and the target quiescent current and add that amount to the current bias voltage to obtain the adjusted bias voltage. After determining the adjusted bias voltage to be applied to the amplifier input 105, the control circuitry 116 signals, commands, or otherwise operates the biasing arrangement 118 to increase or decrease the bias voltage at the amplifier input 105 to be equal to the adjusted bias voltage.

In exemplary embodiments, the loop defined by tasks 206, 208, 210, 212, 216 and 218 repeats throughout execution of the biasing process 200 until the estimated quiescent current is substantially equal to the target quiescent current or a fault condition is identified. In this regard, in a similar manner as described, while the adjusted bias voltage is applied, the control circuitry 116 obtains an updated measured die-to-lead voltage from the voltage measuring arrangement 114, calculates or otherwise determines an updated estimated quiescent current through the amplifier arrangement 104 in response to the adjusted bias voltage, and determines whether the updated estimated quiescent current is substantially equal to the target quiescent current (tasks 206, 208, 210). As described above, when the updated estimated quiescent current is not substantially equal to the target quiescent current, the control circuitry 116 repeats the steps of determining an updated adjusted bias voltage for the amplifier arrangement 104 and operates the biasing arrangement 118 to provide the updated adjusted bias voltage to the amplifier input 105 (tasks 216, 218). When the estimated quiescent current is determined to be substantially equal to the target quiescent current, in exemplary embodiments, the biasing process 200 continues by maintaining that bias voltage applied to the amplifier arrangement throughout subsequent operation of the amplifier device until the biasing process 200 is reinitiated (task 220). For example, the control circuitry 116 may store or otherwise maintain information pertaining to the current bias voltage or the current configuration of the biasing arrangement 118 so that the bias voltage applied to the amplifier input 105 does not change during subsequent operation of the amplifier device 102. In this regard, in some embodiments, the control circuitry 116 may store the configuration information for the biasing arrangement 118 in non-volatile memory so that the bias voltage that achieves the target quiescent current is applied to the amplifier arrangement 104 after the supply voltage for the amplifier device 102 has been removed then reapplied. In various embodiments, the bias control system 110 and/or control circuitry 116 may signal external circuitry to indicate the biasing process 200 is complete and/or provide the resulting bias voltage that provides the target quiescent current to external circuitry.

Figure 3:
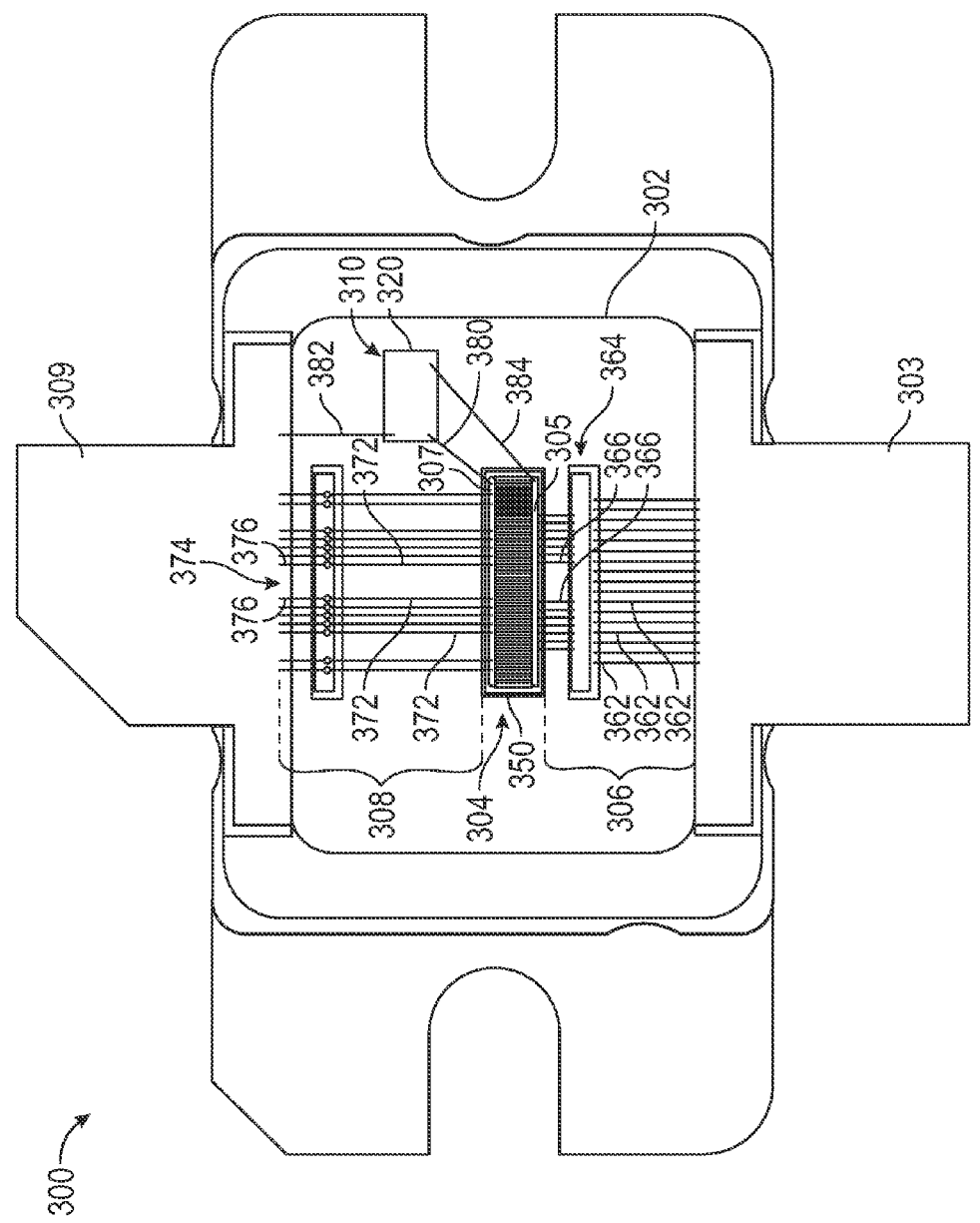
FIG. 3 is a top plan view of a device package suitable for use in the amplifier system of FIG. 1 in accordance with one embodiment of the invention.

FIG. 3 depicts a top view of an exemplary embodiment of a device package 300 suitable for use in the amplifier system 100 of FIG. 1. The device package 300 includes, without limitation, a package substrate 302, an amplifier arrangement 304, input impedance matching circuitry 306 coupled between an input package lead 303 and an input terminal 305 of the amplifier arrangement 304, output impedance matching circuitry 308 coupled between an output package lead 309 and an output terminal 307 of the amplifier arrangement 304, and a control device 310 that incorporates a control system (e.g., bias control system 110) that is configured to measure or otherwise obtain a voltage between the output terminal 307 and the output package lead 309 and adjust the bias voltage applied to the input terminal 305 of the amplifier arrangement 304 to achieve a target quiescent current through the amplifier arrangement 304. The elements of the device package 300 are similar to their counterpart elements described above in the context of the amplifier device 102 of FIG. 1, and accordingly, such common aspects will not be redundantly described here in the context of FIG. 3.

In exemplary embodiments, the package substrate 302 is realized as a metal substrate (e.g., copper or the like) that functions as the primary mounting structure for the device package 300 and provides an electrical ground reference voltage (e.g., ground reference voltage node 111) for the device package 300. The amplifier arrangement 304 is preferably realized as one or more transistors fabricated or otherwise formed on a semiconductor substrate (or die) 350 that is formed on or otherwise mounted or affixed to the package substrate 302. In this regard, the input terminal 305 corresponds to a first conductive contact region formed on the transistor die 350 for connecting to the control (or gate) terminal of the transistor(s) where the input signal is to be provided, and the output terminal 307 corresponds to a conductive contact region formed on the transistor die 350 for connecting to the corresponding terminal of the transistor(s) where the amplified output signal is present. For example, when the amplifier arrangement 304 is realized as an N-type transistor, contact region 307 may correspond to the drain terminal of the transistor 304 and contact region 305 may correspond to the gate terminal of the transistor 304, while the source terminal is coupled to the ground reference voltage provided by the package substrate 302 (e.g., by mounting the transistor die 350 so that the source terminal contacts the package substrate 302).

In the illustrated embodiment, the input impedance matching circuitry 306 is realized as a shunt capacitance (or "T-match") impedance matching circuit topology that includes a first inductive element realized one or more conductive wires 362 (or bondwires), with each wire 362 having a first end that is soldered, bonded, affixed, or otherwise electrically connected to the input package lead 303 and an opposing end that is soldered, bonded, affixed, or otherwise electrically connected to a capacitive element 364 formed or otherwise provided on the package substrate 302. The input impedance matching circuitry 306 also includes a second inductive element realized one or more conductive wires 366 having a first end that is soldered, bonded, affixed, or otherwise electrically connected to the capacitive element 364 and an opposing end that is soldered, bonded, affixed, or otherwise electrically connected to the gate terminal contact region 305 on the transistor die 350. In the illustrated embodiment, the capacitive element 364 is realized as a metal-oxide-semiconductor (MOS) capacitor that includes a bottom conductive layer, such as a layer of a doped silicon material, formed on the package substrate 302, a layer of a dielectric material, such as an oxide material, formed overlying the bottom conductive layer, and an upper conductive layer, such as layer of a metal material, formed overlying the layer of dielectric material that is electrically connected to the bondwires 362, 366. It should be appreciated that the capacitive element 364 is not intended to be limited to a MOS capacitor structure, and in practice, the capacitive element 364 may be realized using another suitable capacitor structure. In exemplary embodiments, the numbers and/or lengths of the bondwires 362, 366 are chosen to provide desired inductances to/from the capacitive element 364 and the capacitive element 364 is configured to provide a desired capacitance, so that the combination of the inductances provided by the bondwires 362, 366 and the capacitive element 364 result in a desired impedance at the input package lead 303.

Similarly, the illustrated output impedance matching circuitry 308 is realized as a shunt capacitance (or "T-match") impedance matching circuit topology that includes a first inductive element realized one or more bondwires 372 having a first end that is soldered, bonded, affixed, or otherwise electrically connected to the drain terminal contact region 307 on the transistor die 350 and an opposing end that is soldered, bonded, affixed, or otherwise electrically connected to a capacitive element 374 formed or otherwise provided on the package substrate 302. The output impedance matching circuitry 308 also includes a second inductive element realized one or more bondwires 376 having a first end that is soldered, bonded, affixed, or otherwise electrically connected to the capacitive element 374 and an opposing end that is soldered, bonded, affixed, or otherwise electrically connected to the output package lead 309. In the illustrated embodiment, the capacitive element 374 is realized as a MOS capacitor chosen to provide a capacitance that, in combination with the inductances provided by the bondwires 372, 376, results in a desired impedance at the output package lead 309.

In the illustrated embodiment, the control device 310 is realized using a separate die 320 contained within the device package 300 that is affixed, bonded, or otherwise mounted to the package substrate 302 and includes a control system (e.g., bias control system 110) configured to support the biasing process 200 of FIG. 2. In this regard, a voltage measurement arrangement (e.g., voltage measuring arrangement 114), a biasing arrangement (e.g., biasing arrangement 118) and control circuitry (e.g., control circuitry 116) are formed or otherwise provided on the die 320 of the control device 310 that is mounted to the package substrate 302. As illustrated, the device package 300 includes an individual bondwire 380 having a first end that is soldered, bonded, affixed, or otherwise electrically connected to the drain terminal contact region 307 and an opposing end that is soldered, bonded, affixed, or otherwise electrically connected to an input of the control device 310 corresponding to a first high impedance input (e.g., high impedance input node 124) of the voltage measurement arrangement provided on die 320. The device package 300 also includes an individual bondwire 382 having a first end that is soldered, bonded, affixed, or otherwise electrically connected to the output package lead 309 and an opposing end that is soldered, bonded, affixed, or otherwise electrically connected to an input of the control device 310 corresponding to a second high impedance input (e.g., high impedance input node 126) of the voltage measurement arrangement provided on die 320. In this manner, the control device 310 is capable of measuring or otherwise obtaining the die-to-lead voltage across the output impedance matching circuitry 308 while the relatively high impedance of the voltage measurement arrangement results in negligible voltage drop across the bondwires 380, 382 by virtue of the negligible (or substantially zero) current flowing through the bondwires 380, 382, as described above in the context of FIG. 1. As a result, the voltage measurement arrangement on the die 320 may measure the difference between the voltage of the drain terminal contact region 307 and the voltage at the output package lead 309 without the measured die-to-lead voltage being influenced by the bondwires 380, 382. Additionally, the bondwires 380, 382 do not influence subsequent operation of the device package 300 by virtue of the high impedances at the inputs of the control device 310 that the bondwires 380, 382 are connected to.

The device package 300 also includes another individual bondwire 384 having a first end that is soldered, bonded, affixed, or otherwise electrically connected to the gate terminal contact region 305 and an opposing end that is soldered, bonded, affixed, or otherwise electrically connected to an output of the control device 310 corresponding to an output of the biasing arrangement provided on die 320. Thus, as described above in the context of FIG. 2, the control device 310 obtains a measured die-to-lead voltage for the device package 300 via bondwires 380, 382, determines an estimated quiescent current through the transistor 304 based on the characterization of the shunt capacitance (or T-match) output impedance matching circuitry 308, and increases and/or decreases the bias voltage at the gate terminal contact region 305 so that the estimated quiescent current through the transistor 304 is substantially equal to a target quiescent current through the transistor 304. The bondwires 380, 382 may be encapsulated or otherwise contained inside the device package 300 along with bondwires 362, 366, 372, 376 of the impedance matching circuitry 306, 308 in a conventional manner.

Figure 4:
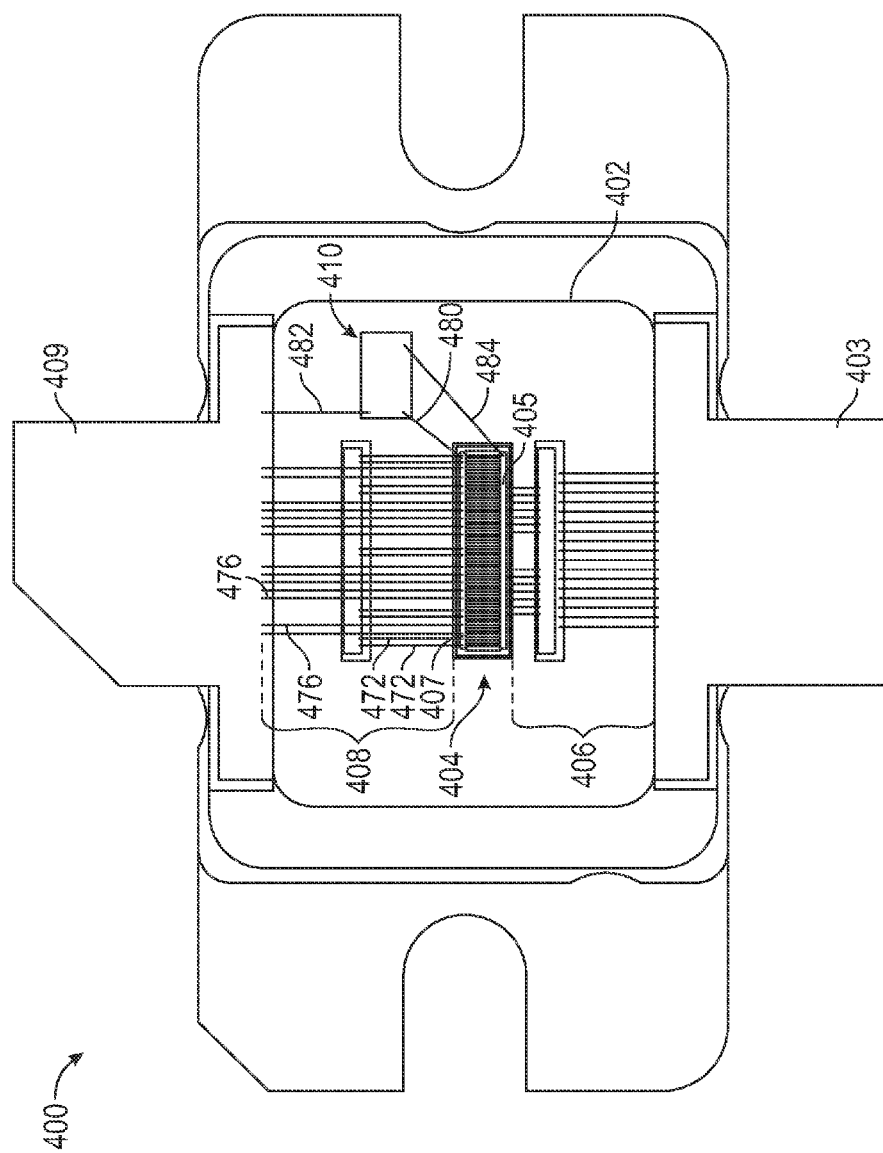
FIG. 4 is a top plan view of a device package suitable for use in the amplifier system of FIG. 1 in accordance with another embodiment of the invention.

FIG. 4 depicts a top view of another exemplary embodiment of a device package 400 suitable for use in the amplifier system 100 of FIG. 1. The device package 400 includes, without limitation, a package substrate 402, an amplifier 404, input impedance matching circuitry 406 coupled between an input package lead 403 and an input terminal 405 of the amplifier 404, output impedance matching circuitry 408 coupled between an output package lead 409 and an output terminal 407 of the amplifier 404, and a control device 410 that incorporates a control system (e.g., bias control system 110) that is configured to support the biasing process 200 of FIG. 2 and other operations of the device package 400 described above. The elements of the device package 400 are similar to their counterpart elements described above in the context of the amplifier device 102 of FIG. 1 and the device package 300 of FIG. 3, and accordingly, such common aspects will not be redundantly described here in the context of FIG. 4.

In the illustrated embodiment, the output impedance matching circuitry 408 is realized as a shunt inductance (or "shunt-L") impedance matching circuit topology that includes a first inductive element realized one or more bondwires 472 having a first end that is soldered, bonded, affixed, or otherwise electrically connected to the drain terminal contact region 407 and an opposing end that is soldered, bonded, affixed, or otherwise electrically connected to a capacitive element 474 formed or otherwise provided on the package substrate 402. The thickness and/or dielectric constant of the dielectric material for the capacitive element 474 is chosen to provide a capacitance so that the voltage of the upper conductive layer of the capacitive element 474 electrically connected to the bondwires 472 corresponds to the RF ground voltage. In this manner, the bondwires 472 provide a shunt inductance to the RF ground voltage. The output impedance matching circuitry 408 also includes a second inductive element realized as one or more bondwires 476 having a first end that is soldered, bonded, affixed, or otherwise electrically connected to the drain terminal contact region 407 and an opposing end that is soldered, bonded, affixed, or otherwise electrically connected to the output package lead 409. As described above, the inductances provided by the bondwires 472, 476 and the capacitance provided by the capacitive element 474 are chosen to provide a desired impedance at the output package lead 409.

As illustrated, the device package 400 includes a first individual bondwire 480 electrically connected between the drain terminal contact region 407 and a first high impedance input of the control device 410 and a second individual bondwire 482 electrically connected between the output package lead 409 and a second high impedance input of the control device 410. In a similar manner as described above, the control device 410 obtains a measured die-to-lead voltage for the device package 400 via bondwires 480, 482 and determines an estimated quiescent current through the transistor 404 based on the characterization of the shunt inductance (or shunt-L) output impedance matching circuitry 408. The device package 400 also includes an individual bondwire 484 coupled between the control device 410 and the gate terminal contact region 405 to allow the control device 410 to increase and/or decrease the bias voltage at the gate terminal contact region 405 so that the estimated quiescent current through the transistor 404 is substantially equal to a target quiescent current through the transistor 404.

Figure 5:
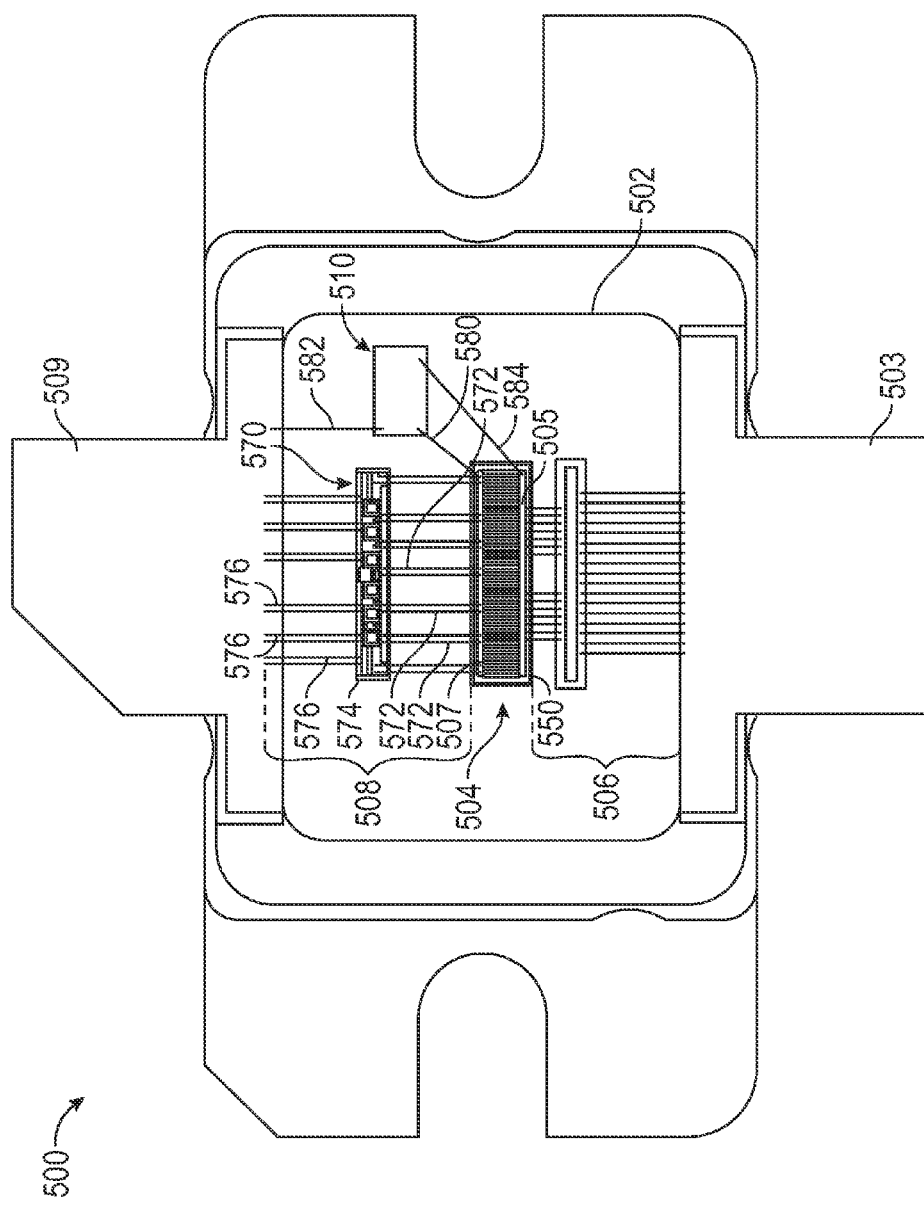
FIG. 5 is a top plan view of a device package suitable for use in the amplifier system of FIG. 1 in accordance with another embodiment of the invention.

FIG. 5 depicts a top view of another exemplary embodiment of a device package 500 suitable for use in the amplifier system 100 of FIG. 1. The device package 500 includes, without limitation, a package substrate 502, an amplifier 504, input impedance matching circuitry 506 coupled between an input package lead 503 and an input terminal 505 of the amplifier 504, output impedance matching circuitry 508 coupled between an output package lead 509 and an output terminal 507 of the amplifier 504, and a control device 510 configured to support the biasing process 200 of FIG. 2 and other operations of the device package 500 described above. The elements of the device package 500 are similar to their counterpart elements described above in the context of FIGS. 1-4, and accordingly, such common aspects will not be redundantly described here in the context of FIG. 5.

In the illustrated embodiment, the output impedance matching circuitry 508 includes an integrated passive device 570 that includes one or more capacitive and/or inductive elements fabricated or otherwise provided on a semiconductor substrate 574 (or die) that is mounted or otherwise affixed to the package substrate 502. The output impedance matching circuitry 508 also includes a first set of one or more bondwires 572 connected between the drain terminal contact region 507 on the transistor die 550 and a first terminal of the integrated passive device 570 and a second set of one or more bondwires 576 connected between a second terminal of the integrated passive device 570. The integrated passive device 570 is configured to provide an impedance that, in combination with the inductances of the bondwires 572, 576, results in a desired output impedance at the output package lead 509. The device package 500 includes an individual bondwire 580 electrically connected between the drain terminal contact region 507 and a first high impedance input of the control device 510, a second individual bondwire 582 electrically connected between the output package lead 509 and a second high impedance input of the control device 510, and a third individual bondwire 584 coupled between the control device 510 and the gate terminal contact region 505. In a similar manner as described above, the control device 510 obtains a measured die-to-lead voltage for the device package 500 via bondwires 580, 582, determines an estimated quiescent current through the transistor 504 based on the characterization of the output impedance matching circuitry 508, and increases and/or decreases the bias voltage at the gate terminal contact region 505 so that the estimated quiescent current through the transistor 504 is substantially equal to a target quiescent current through the transistor 504.

Figure 6:
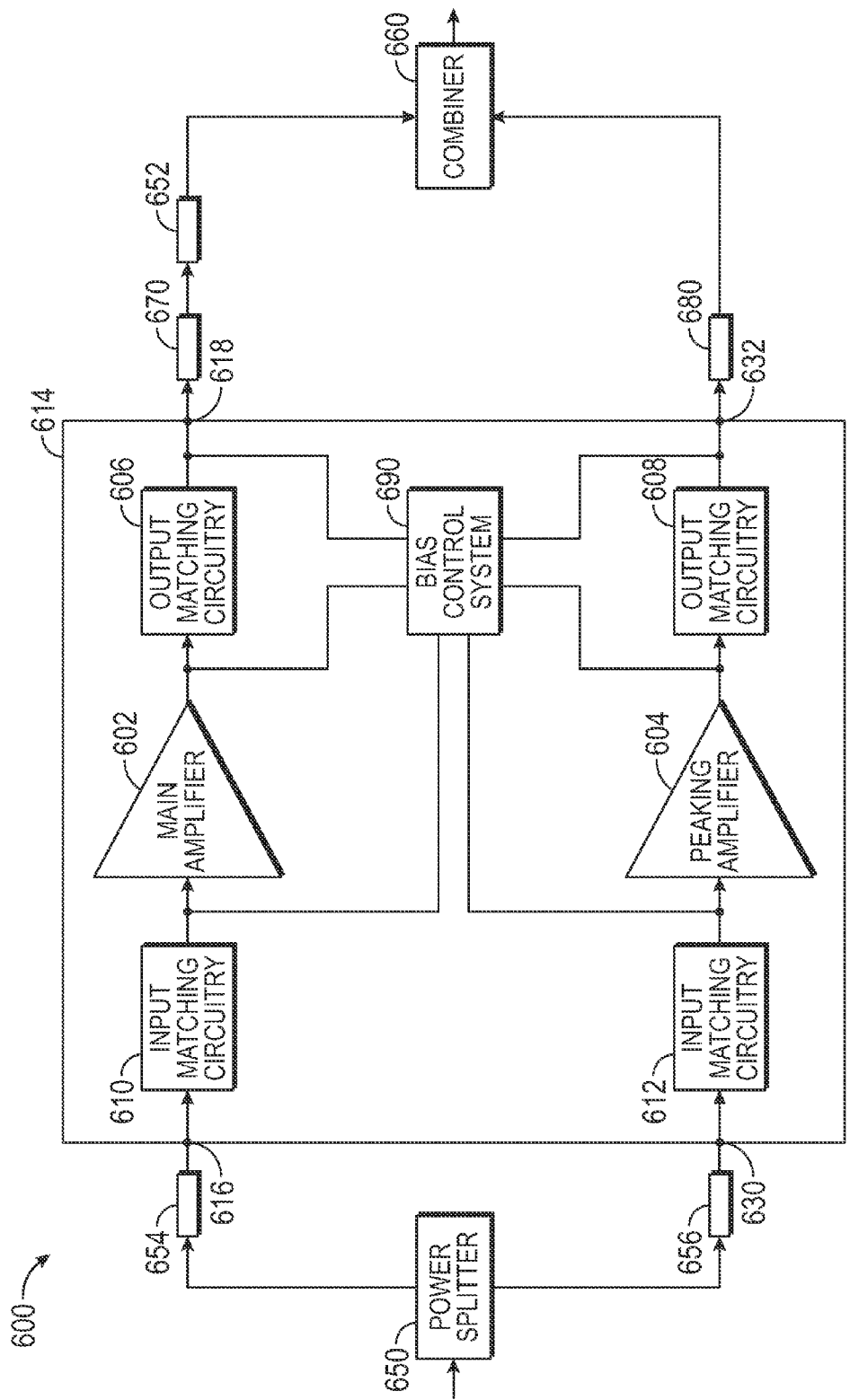
FIG. 6 is a block diagram of an exemplary Doherty amplifier system in accordance with one embodiment of the invention.

FIG. 6 depicts an exemplary embodiment of a Doherty amplifier system 600 including a bias control system 690 configured to support implementation of the biasing process 200. The Doherty amplifier system 600 includes, without limitation, a first amplifier arrangement 602, a second amplifier arrangement 604, first output impedance matching circuitry 606 coupled to the output of the first amplifier arrangement 602, second output impedance matching circuitry 608 coupled to the output of the second amplifier arrangement 604, first input impedance matching circuitry 610 coupled to the input of the first amplifier arrangement 602, and second input impedance matching circuitry 612 coupled to the input of the second amplifier arrangement 604. In an exemplary embodiment, the second amplifier arrangement 604 is biased such that the second amplifier arrangement 604 functions as the peaking (or auxiliary) amplifier, which provides power when the amplitude of the signal at the input to the second amplifier arrangement 604 is above a threshold and otherwise is turned off when the amplitude of the signal at the input to the second amplifier arrangement 604 is below the threshold, while the first amplifier arrangement 602 is biased such that the first amplifier arrangement 602 is always on and functions as the main (or carrier) amplifier. Accordingly, for convenience, but without limitation, the first amplifier arrangement 602 is alternatively referred to herein as the main amplifier and the second amplifier arrangement 604 is alternatively referred to herein as the peaking amplifier. In the illustrated embodiment, the main amplifier 602, the peaking amplifier 604, the output impedance matching circuitry 606, 608, and the input impedance matching circuitry 610, 612 are packaged into a single amplifier device package 614, as described in greater detail below.

In an exemplary embodiment, the main amplifier 602 is realized as one or more transistors configured as a Class AB amplifier, that is, one or more transistors are biased to provide a conduction angle between 180 and 360 degrees. The first input impedance matching circuitry 610 is coupled between the input of the main amplifier 602 and a first input 616 of the device package 614 and configured to provide a desired input impedance at the first input 616 at the fundamental frequency (or carrier frequency) of the amplifier system 600, and the first output impedance matching circuitry 606 is coupled between the output of the main amplifier 602 and a first output node 618 of the device package 614 and configured to provide a desired output impedance at the output 618 of the device package 614 at the fundamental frequency of the amplifier system 600. In an exemplary embodiment, the amplifier system 600 is used to transmit radio frequency signals, wherein the fundamental frequency (or carrier frequency) is the frequency of transmittance.

In an exemplary embodiment, the peaking amplifier 604 is realized as one or more transistors configured as a Class C amplifier, that is, one or more transistors biased to provide a conduction angle less than 180 degrees. The peaking amplifier 604 is biased to turn on when the main amplifier 602 is saturated, that is, when the input signal (or input voltage) to the peaking amplifier 604 exceeds a threshold signal level (or voltage) indicative of the main amplifier 602 being at or near saturation. The second input impedance matching circuitry 612 is coupled between the input of the peaking amplifier 604 and a second input 630 of the device package 614 and configured to provide a desired input impedance at the second input 630 at the fundamental frequency of the amplifier system 600, and the second output impedance matching circuitry 608 is coupled between the output of the peaking amplifier 604 and a second output node 632 of the device package 614 and configured to provide a desired output impedance at the output 632 of the device package 614 at the fundamental frequency of the amplifier system 600.

In the illustrated embodiment of FIG. 6, the amplifier system 600 includes a power splitter (or power divider) 650 configured to divide the input power of the input signal to be amplified among the main amplifier 602 and the peaking amplifier 604, and each input 616, 630 is coupled to a respective output of the power splitter 650 to receive a portion of the input signal to be amplified by the amplifier system 600. For example, a first output of the power splitter 650 may be coupled to the input 616 corresponding to the main amplifier 602 and a second output of the power splitter 650 may be coupled to the input 630 corresponding to the peaking amplifier 604, and the power splitter 650 may divide the input power equally among the amplifiers 602, 604, such that roughly fifty percent of the input signal power is provided to the main amplifier 602 at input 616 and fifty percent of the input signal power is provided to the peaking amplifier 604 at input 630. As described above, in an exemplary embodiment, the peaking amplifier 604 is biased for Class C operation, such that the peaking amplifier 604 is turned off when the input signal power (or voltage) at the input 630 is less than a threshold amount that indicates that the main amplifier 602 is at or near saturation.

In an exemplary embodiment, each output 618, 632 of the device package 614 is coupled to a respective input to a power combiner 660 that combines the amplified output signals at the outputs 618, 632 to produce an amplified version of the input signal provided to the power splitter 650. As illustrated, impedance transforming elements 652, 654, 656, 658, such as impedance transformers or transmission lines, may be coupled between the respective inputs 616, 630 and/or outputs 618, 632 of the device package 614 and the corresponding outputs of the power splitter 650 and/or inputs of the power combiner 660 to achieve desired phase shifts for Doherty operation, as will be appreciated in the art.

In a similar manner as described above in the context of the bias control system 110 of FIG. 1, the bias control system 690 is coupled to the output of the main amplifier 602 and the main amplifier package output 618 to measure or otherwise obtain the voltage between the main amplifier output and the main amplifier package output 618. The bias control system 690 determines an estimated quiescent current through the main amplifier 602 based on the measured voltage across the output matching circuitry 606 and the previously characterized relationship between the current through the output matching circuitry 606 and the voltage across the output matching circuitry 606. The bias control system 690 is coupled to the input of the main amplifier 602, and based on the difference between the estimated quiescent current and a target quiescent current through the main amplifier 602, the bias control system 690 adjusts the bias voltage at the input of the main amplifier 602 until the estimated quiescent current is substantially equal to the target quiescent current, as described above in the context of FIG. 2. As illustrated, the bias control system 690 is also coupled to the input of the peaking amplifier 604 and adjusts the bias voltage at the input of the peaking amplifier 604 in a manner corresponding to the adjustment to the bias voltage at the main amplifier 602. In this regard, based on the relationship between the different operating modes (or classes) of the amplifiers 602, 604, the bias control system 690 may maintain the bias voltage applied to the peaking amplifier 604 at a fixed ratio of the bias voltage applied to the main amplifier 602. Thus, the bias voltage of the peaking amplifier 604 is also adjusted based on the difference between the estimated quiescent current and a target quiescent current through the main amplifier 602. In some embodiments, the device package 614 may include additional input and/or output interfaces configured to allow the ratio of between the bias voltage applied to the peaking amplifier 604 and the bias voltage applied to the main amplifier 602 to be adjusted by external systems and/or devices during operation of the amplifier system 600.

Figure 7:
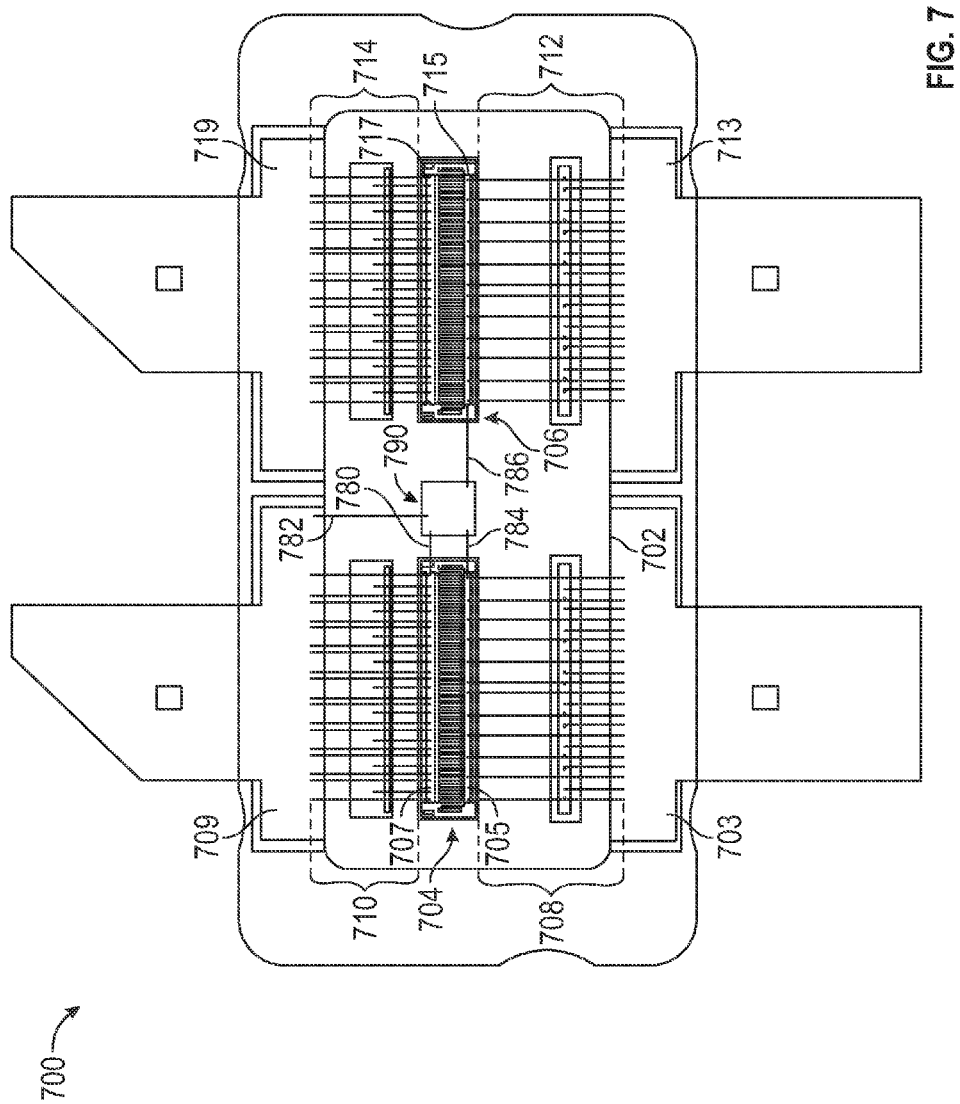
FIG. 7 is a top plan view of a device package suitable for use in the Doherty amplifier system of FIG. 6 in accordance with one embodiment of the invention.

It should be understood that FIG. 6 is a simplified representation of a Doherty amplifier system 600 for purposes of explanation and ease of description, and that practical embodiments may include other devices and components to provide additional functions and features, and/or the amplifier system 600 may be part of a much larger electrical system, as will be understood. Thus, although FIG. 6 depicts direct electrical connections between circuit elements and/or terminals, alternative embodiments may employ intervening circuit elements and/or components while functioning in a substantially similar manner FIG. 7 depicts a top view of an exemplary embodiment of a device package 700 suitable for use in the Doherty amplifier system 600 of FIG. 6. The device package 700 includes, without limitation, a package substrate 702, a main amplifier 704, a peaking amplifier 706, main amplifier input impedance matching circuitry 708 coupled between a first input package lead 703 and an input terminal 705 of the main amplifier 704, main amplifier output impedance matching circuitry 710 coupled between a first output package lead 709 and an output terminal 707 of the main amplifier 704, peaking amplifier input impedance matching circuitry 712 coupled between a second input package lead 713 and an input terminal 715 of the peaking amplifier 706, peaking amplifier output impedance matching circuitry 714 coupled between a second output package lead 719 and an output terminal 717 of the peaking amplifier 706, and a control device 790. As described above, the control device 790 incorporates a control system (e.g., bias control system 690) that is configured to measure or otherwise obtain a voltage between the main amplifier output terminal 707 and the main amplifier output package lead 709 and adjust the bias voltage applied to the input terminal 705 of the main amplifier 704 to achieve a target quiescent current through the main amplifier 704. Additionally, in response to adjusting the bias voltage at the input terminal 705 of the main amplifier 704, the control device 790 adjusts the bias voltage applied to the input terminal 715 of the peaking amplifier 706 to maintain operation of the peaking amplifier 706 in the desired operating mode (or class) with respect to the main amplifier 704. The elements of the device package 700 are similar to their counterpart elements described above in the context of FIGS. 1-6, and accordingly, such common aspects will not be redundantly described here in the context of FIG. 7.

The device package 700 includes an individual bondwire 780 electrically connected between the drain terminal contact region 707 of the main amplifier 704 and a first high impedance input of the control device 790, a second individual bondwire 782 electrically connected between the main amplifier output package lead 709 and a second high impedance input of the control device 790, and a third individual bondwire 784 coupled between the control device 790 and the gate terminal contact region 705 of the main amplifier 704. In a similar manner as described above, the control device 790 obtains a measured die-to-lead voltage for the main amplifier 704 via bondwires 780, 782, determines an estimated quiescent current through the main amplifier 704 based on the previously characterized relationship between voltage and current for the output impedance matching circuitry 710, and increases and/or decreases the bias voltage at the gate terminal contact region 705 so that the estimated quiescent current through the main amplifier 704 is substantially equal to a target quiescent current through the main amplifier 704. The device package 700 also includes a fourth individual bondwire 786 electrically connected between the control device 790 and the gate terminal contact region 715 of the peaking amplifier 706, wherein the control device 790 adjusts the bias voltage at the gate terminal contact region 715 in a manner corresponding to the adjustment to the bias voltage at the gate terminal contact region 705 of the main amplifier 704 to maintain desired operation of the peaking amplifier 706 with respect to the main amplifier 704. For example, for the Doherty amplifier implementation, the control device 790 adjusts the bias voltage at the gate terminal contact region 715 in a manner corresponding to the adjustment to the bias voltage at the gate terminal contact region 705 of the main amplifier 704 to ensure that the peaking amplifier 706 is only turned on when the main amplifier 704 is at or near saturation.

For the sake of brevity, conventional techniques related to voltage sensing, impedance matching, semiconductor and/or integrated circuit fabrication, device packaging, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

In one exemplary embodiment, an amplifier system is provided that includes an amplifier device comprising an output interface, an amplifier arrangement having an amplifier output, and impedance matching circuitry coupled between the amplifier output and the output interface, and a control system coupled to the amplifier output and the output interface to determine an estimated current through the amplifier arrangement based on a voltage between the amplifier output and the output interface. The amplifier arrangement has an amplifier input, wherein the control system adjusts a bias voltage at the amplifier input based on the estimated current. In one embodiment, the amplifier system further comprises an input interface to receive an indication of a target current, wherein the control system adjusts the bias voltage at the amplifier input based on a difference between the estimated current and the target current. In another embodiment, the amplifier device comprises a second amplifier arrangement having a second amplifier input and the control system adjusts a second bias voltage at the second amplifier input in response to adjusting the bias voltage at the amplifier input to maintain a desired operating relationship between the second amplifier arrangement and the amplifier arrangement. In one or more embodiments, the control system includes a first high impedance input node coupled to the amplifier output and a second high impedance input node coupled to the output interface, wherein an input impedance between the first high impedance input node and the second high impedance input node is greater than an impedance of the impedance matching circuitry. In some embodiments, a first conductive element is coupled between the first high impedance input node and the amplifier output and a second conductive element is coupled between the second high impedance input node and the output interface. In other embodiments, the control system includes a voltage measuring arrangement coupled to the first high impedance input node and the second high impedance input node to obtain a measured voltage between the amplifier output and the output interface. In a further embodiment, the amplifier arrangement has an amplifier input, wherein the control system includes a biasing arrangement coupled to the amplifier input to provide a bias voltage to the amplifier input and control circuitry coupled to the voltage measuring arrangement and the biasing arrangement to determine the estimated current based on the measured voltage and operate the biasing arrangement to adjust the bias voltage based on the estimated current. In yet another embodiment, the amplifier system further comprises an input interface to receive indication of a target current through the amplifier arrangement, wherein the control circuitry is coupled to the input interface to identify the target current and operate the biasing arrangement to adjust the bias voltage at the amplifier input based on a difference between the estimated current and the target current. In accordance with yet another embodiment, the control system determines the estimated current as a function of the voltage based on a relationship between a voltage across the impedance matching circuitry and a corresponding current through the impedance matching circuitry. In another embodiment, the impedance matching circuitry comprises a shunt inductance impedance matching circuit or a shunt capacitance impedance matching circuit.

In another exemplary embodiment, an apparatus for an amplifier device package is provided. The amplifier device package includes an amplifier arrangement having an output terminal, an output interface electrically connected to the output terminal, a first conductive element connected between the output terminal and a first node, and a second conductive element connected between the output interface and a second node, wherein an input impedance between the first node and the second node is greater than an impedance between the output terminal and the output interface. In one embodiment, the amplifier device package further comprises a voltage measuring arrangement coupled to the first node and the second node to obtain a measured voltage between the output terminal and the output interface. In a further embodiment, the amplifier device package comprises a third conductive element coupled to an input terminal of the amplifier arrangement, a biasing arrangement coupled to the third conductive element to provide a bias voltage to the input terminal of the amplifier arrangement, and control circuitry coupled to the voltage measuring arrangement and the biasing arrangement to determine an estimated quiescent current through the amplifier arrangement based on the measured voltage and adjust the bias voltage based on a difference between the estimated quiescent current and a target quiescent current. In one embodiment, the amplifier device package includes a package substrate, wherein the amplifier arrangement is provided on a first die mounted to the package substrate and the voltage measuring arrangement is provided on a second die mounted to the package substrate.

Another exemplary embodiment comprises a method for biasing an amplifier system. The method involves obtaining a voltage difference between an output of an amplifier arrangement and an output interface of the amplifier system, determining an estimated quiescent current through the amplifier arrangement based on the voltage difference, and adjusting a bias voltage provided to an input of the amplifier arrangement based on the estimated quiescent current. In one embodiment, the amplifier system comprises a plurality of bondwires coupled between the output of the amplifier arrangement and the output interface, wherein obtaining the voltage difference between the output of the amplifier arrangement and the output interface comprises obtaining a first voltage at a first node via a first individual bondwire connected to the first node, obtaining a second voltage at a second node via a second individual bondwire connected to the second node, and measuring a difference between the first voltage and the second voltage to obtain the voltage between the output of the amplifier arrangement and the output interface. In another embodiment, adjusting the bias voltage comprises adjusting the bias voltage based on a difference between the estimated quiescent current and a target quiescent current until the difference is less than a threshold value. In yet another embodiment, the method further comprises adjusting a second bias voltage provided to a second input of a second amplifier arrangement of the amplifier system based on the estimated quiescent current to maintain a desired operation of the second amplifier arrangement with respect to the amplifier arrangement.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. An amplifier system comprising:
an amplifier device comprising an output interface, an amplifier arrangement having an amplifier input and an amplifier output, and impedance matching circuitry coupled between the amplifier output and the output interface; and
a control system coupled to the amplifier output and the output interface to determine an estimated current through the amplifier arrangement based on a voltage between the amplifier output and the output interface and adjust a bias voltage at the amplifier input based on the estimated current.

2. The amplifier system of claim 1, further comprising an input interface to receive an indication of a target current, wherein the control system adjusts the bias voltage at the amplifier input based on a difference between the estimated current and the target current.

3. The amplifier system of claim 1, wherein:
the amplifier device comprises a second amplifier arrangement having a second amplifier input; and
the control system adjusts a second bias voltage at the second amplifier input in response to adjusting the bias voltage at the amplifier input to maintain a desired operating relationship between the second amplifier arrangement and the amplifier arrangement.

4. The amplifier system of claim 1, wherein the control system includes a first high impedance input node coupled to the amplifier output and a second high impedance input node coupled to the output interface.

5. An amplifier system comprising:
an amplifier device comprising an output interface, an amplifier arrangement having an amplifier output, and impedance matching circuitry coupled between the amplifier output and the output interface; and
a control system coupled to the amplifier output and the output interface to determine an estimated current through the amplifier arrangement based on a voltage between the amplifier output and the output interface, the control system including a first high impedance input node coupled to the amplifier output and a second high impedance input node coupled to the output interface, wherein an input impedance between the first high impedance input node and the second high impedance input node is greater than an impedance of the impedance matching circuitry.

6. The amplifier system of claim 5, further comprising:
a first conductive element coupled between the first high impedance input node and the amplifier output; and
a second conductive element coupled between the second high impedance input node and the output interface.

7. An amplifier system comprising:
an amplifier device comprising an output interface, an amplifier arrangement having an amplifier output, and impedance matching circuitry coupled between the amplifier output and the output interface; and
a control system coupled to the amplifier output and the output interface to determine an estimated current through the amplifier arrangement based on a voltage between the amplifier output and the output interface, the control system including a first high impedance input node coupled to the amplifier output and a second high impedance input node coupled to the output interface, wherein the control system includes a voltage measuring arrangement coupled to the first high impedance input node and the second high impedance input node to obtain a measured voltage between the amplifier output and the output interface.

8. The amplifier system of claim 7, the amplifier arrangement having an amplifier input, wherein the control system includes:
a biasing arrangement coupled to the amplifier input to provide a bias voltage to the amplifier input; and
control circuitry coupled to the voltage measuring arrangement and the biasing arrangement to determine the estimated current based on the measured voltage and operate the biasing arrangement to adjust the bias voltage based on the estimated current.

9. The amplifier system of claim 8, further comprising an input interface to receive indication of a target current through the amplifier arrangement, wherein the control circuitry is coupled to the input interface to identify the target current and operate the biasing arrangement to adjust the bias voltage at the amplifier input based on a difference between the estimated current and the target current.

10. An amplifier system comprising:
an amplifier device comprising an output interface, an amplifier arrangement having an amplifier output, and impedance matching circuitry coupled between the amplifier output and the output interface; and
a control system coupled to the amplifier output and the output interface to determine an estimated current as a function of a voltage between the amplifier output and the output interface based on a relationship between a voltage across the impedance matching circuitry and a corresponding current through the impedance matching circuitry.

11. An amplifier system comprising:
an amplifier device comprising an output interface, an amplifier arrangement having an amplifier output, and impedance matching circuitry coupled between the amplifier output and the output interface, wherein the impedance matching circuitry comprises a shunt inductance impedance matching circuit or a shunt capacitance impedance matching circuit; and
a control system coupled to the amplifier output and the output interface to determine an estimated current through the amplifier arrangement based on a voltage between the amplifier output and the output interface.

12. An amplifier device package comprising:
an amplifier arrangement having an output terminal;
an output interface electrically connected to the output terminal;
a first conductive element connected between the output terminal and a first node;
a second conductive element connected between the output interface and a second node, wherein an input impedance between the first node and the second node is greater than an impedance between the output terminal and the output interface; and
a voltage measuring arrangement coupled to the first node and the second node to obtain a measured voltage between the output terminal and the output interface.

13. The amplifier device package of claim 12, further comprising:
a third conductive element coupled to an input terminal of the amplifier arrangement;
a biasing arrangement coupled to the third conductive element to provide a bias voltage to the input terminal of the amplifier arrangement; and
control circuitry coupled to the voltage measuring arrangement and the biasing arrangement to determine an estimated quiescent current through the amplifier arrangement based on the measured voltage and adjust the bias voltage based on a difference between the estimated quiescent current and a target quiescent current.

14. The amplifier device package of claim 12, further comprising package substrate, wherein the amplifier arrangement is provided on a first die mounted to the package substrate and the voltage measuring arrangement is provided on a second die mounted to the package substrate.

15. A method for biasing an amplifier system, the amplifier system comprising a plurality of bondwires coupled between the output of the amplifier arrangement and the output interface, the method comprising:
   obtaining a voltage difference between an output of an amplifier arrangement and an output interface of the amplifier system, wherein obtaining the voltage difference between the output of the amplifier arrangement and the output interface comprises:
      obtaining a first voltage at a first node via a first individual bondwire connected to the first node;
      obtaining a second voltage at a second node via a second individual bondwire connected to the second node; and
      measuring a difference between the first voltage and the second voltage to obtain the voltage between the output of the amplifier arrangement and the output interface;
   determining an estimated quiescent current through the amplifier arrangement based on the voltage difference; and
   adjusting a bias voltage provided to an input of the amplifier arrangement based on the estimated quiescent current.

16. A method for biasing an amplifier system, the method comprising:
   obtaining a voltage difference between an output of an amplifier arrangement and an output interface of the amplifier system;
   determining an estimated quiescent current through the amplifier arrangement based on the voltage difference; and
   adjusting a bias voltage provided to an input of the amplifier arrangement based on a difference between the estimated quiescent current and a target quiescent current until the difference is less than a threshold value.

17. A method for biasing an amplifier system, the method comprising:
   obtaining a voltage difference between an output of an amplifier arrangement and an output interface of the amplifier system;
   determining an estimated quiescent current through the amplifier arrangement based on the voltage difference;
   adjusting a bias voltage provided to an input of the amplifier arrangement based on the estimated quiescent current; and
   adjusting a second bias voltage provided to a second input of a second amplifier arrangement of the amplifier system based on the estimated quiescent current to maintain a desired operation of the second amplifier arrangement with respect to the amplifier arrangement.

* * * * *